United States Patent
Shimazawa et al.

(10) Patent No.: US 6,943,998 B2
(45) Date of Patent: Sep. 13, 2005

(54) TUNNEL MAGNETORESISTIVE EFFECTIVE ELEMENT, AND A THIN FILM MAGNETIC HEAD, A MAGNETIC HEAD DEVICE AND A MAGNETIC DISK DRIVE DEVICE USING SAME

(75) Inventors: Koji Shimazawa, Chuo-Ku (JP); Tsuyoshi Umehara, Chuo-Ku (JP); Satoru Araki, Chuo-Ku (JP)

(73) Assignee: TDK Corporation, Tokyo (JP)

( * ) Notice: Subject to any disclaimer, the term of this patent is extended or adjusted under 35 U.S.C. 154(b) by 559 days.

(21) Appl. No.: 09/824,060

(22) Filed: Apr. 3, 2001

(65) Prior Publication Data

US 2001/0033464 A1 Oct. 25, 2001

(30) Foreign Application Priority Data

Apr. 19, 2000 (JP) ........................................ 2000-118447

(51) Int. Cl.[7] .............................................. G11B 5/127
(52) U.S. Cl. ..................................................... 360/324.2
(58) Field of Search ...................................... 360/324.2

(56) References Cited

U.S. PATENT DOCUMENTS

| | | | |
|---|---|---|---|
| 5,729,410 A | 3/1998 | Fontana, Jr. et al. | 360/324.2 |
| 5,862,022 A | 1/1999 | Noguchi et al. | 360/324.2 |
| 5,898,547 A | 4/1999 | Fontana, Jr. et al. | 360/324.2 |
| 5,898,548 A | 4/1999 | Dill et al. | 360/324.2 |
| 5,901,018 A | 5/1999 | Fontana, Jr. et al. | 360/324.2 |
| 6,052,263 A * | 4/2000 | Gill | 360/324.11 |

FOREIGN PATENT DOCUMENTS

| | | |
|---|---|---|
| JP | 63-55714 | 3/1988 |
| JP | 10-255231 | 9/1998 |
| JP | A 11-171869 | 6/1999 |
| JP | 11-213351 | 8/1999 |

* cited by examiner

*Primary Examiner*—David Davis
(74) *Attorney, Agent, or Firm*—Oliff & Berridge, PLC

(57) ABSTRACT

A tunnel magnetoresistive effective element has a ferromagnetic tunnel effective film with a free layer, a pinned layer and a tunnel barrier layer sandwiched between the free layer and the pinned layer, a magnetic bias means, a first conductive layer, and a second conductive layer. The magnetic bias means apply a bias magnetic field to the free layer of the ferromagnetic tunnel effective film. The first conductive layer and the second conductive layer generate magnetic fields having the same direction as that of the bias magnetic field through a sense current therein to reinforce the bias magnetic field.

17 Claims, 17 Drawing Sheets

TUNNEL MAGNETORESISTIVE EFFECTIVE ELEMENT, AND A THIN FILM MAGNETIC HEAD, A MAGNETIC HEAD DEVICE AND A MAGNETIC DISK DRIVE DEVICE USING SAME

BACKGROUND OF THE INVENTION

1. Field of the Invention

This invention relates to a tunnel magnetoresistive effective element (hereinafter, often called as a "TMR element"), a thin film magnetic head, a magnetic head device and a magnetic disk drive device.

2. Related Art Statement

With the development of the recording density in hard disks (HDDs), it is required to enhance the sensitivity and the output power in the HDDs. Recently, attention is paid to TMR elements to satisfy the above requirements in the HDDs. The TMR element has a ferromagnetic tunnel film with a multilayered structure of a ferromagnetic layer/a tunnel barrier layer/a ferromagnetic layer. The ferromagnetic tunnel effect is defined as the change of the tunnel current in the tunnel barrier layer depending on the relative angle between both of the ferromagnetic layers when flowing a current between the ferromagnetic layers. In this case, the tunnel barrier layer is composed of such a thin insulating film that electrons can penetrate through the tunnel barrier layer with maintaining their spin conditions.

It is reported that the TMR element has a large resistance change ratio $\Delta R/R$ of 12% and over. Then, the TMR elements are expected as next generation sensors to substitute for spin valve film (hereinafter, called as a "SV film") elements, but they have been just applied for magnetic heads, so that as of now, it is required to make the most use of the TMR elements in the magnetic heads. That is, it is required to design a new magnetic head structure which is not proposed in the past because in using the ferromagnetic tunnel effective film of the TMR element, a current is flown in the stacking direction thereof.

U.S. Pat. Nos. 5,729,410, 5,898,547, 5,898,548 and 5,901,018 disclose conventional magnetic head structures using the TMR elements which are improved in order to realize their super high density recording. However, the requirement for the super high density recording in the TMR magnetic heads are increased, and recently, high-performance TMR magnetic heads are desired.

For example, in using the TMR element as a reading element of a thin film magnetic head, it is very important to design a bias magnetic field means for the free layer. Since a current is flown in a direction perpendicular to the TMR element, that is, the stacking direction, the contact of a hard magnet to the end of the TMR element may cause the short circuit of the TMR element as in a GMR head. As a result, a given current is flown in the tunnel barrier layer and a sufficient output power can be obtained due to the insufficient TMR change ratio.

In order to remove the above matter, U.S. Pat. No. 5,729,410 discloses that a thin insulating layer is provided between the hard magnet and the TMR element for insulation. Moreover, the present inventors have proposed in Japanese Patent Application No.11-171869 that a flux probe portion made of a T-shaped soft magnetic film, of which the base portion is elongated beyond the ferromagnetic tunnel effective film of the TMR element, is provided in the TMR element, and the hard magnet and an antiferromagnetic layer are provided on both edges of the base portion of the flux probe portion.

However, magnetic recording patterns in a magnetic media are reduced with the development of the recording density and thus, it is required to reduce the size of the TMR element to be mounted on a reproducing head. For example, in order to realize a recording density of 40 Gbspi, the TMR element should be reduced to the size of about 0.4×0.4 ($\mu m^2$), and thus, the hard magnet and the antiferromagnetic films should be reduced. Therefore, if the above prior art technique is applied, it is difficult to apply a sufficient bias magnetic field to the free layer.

SUMMARY OF THE INVENTION

It is an object of the present invention to provide a TMR element, a thin film magnetic head, a magnetic head device and a magnetic disk drive device which are applicable for super high density recording.

It is another object of the present invention to provide a TMR element, a thin film magnetic head, a magnetic head device and a magnetic disk drive device which can enhance the bias magnetic field to be applied to the free layer of the TMR element.

To iron out the above matters, a TMR element according to the present invention includes a ferromagnetic tunnel effective film, a magnetic bias means, a first conductive layer and a second conductive layer.

The ferromagnetic tunnel effective film includes a tunnel barrier layer, a free layer and a pinned layer, and the tunnel barrier layer is sandwiched between the free layer and the pinned layer. Then, a bias magnetic field is applied to the free layer from the magnetic bias means.

The first conductive layer is provided on one surface of the ferromagnetic tunnel effective film and electrically conducted to the ferromagnetic tunnel effective film. The second conductive layer is provided on the other surface of the ferromagnetic tunnel effective film and electrically conducted to the ferromagnetic tunnel effective film.

Then, at least one of the first conductive layer and the second conductive layer generates a magnetic field having the same direction as that of the bias magnetic field through a sense current therein.

The TMR element according to the present invention has a ferromagnetic tunnel effective film composed of a multi-layered structure of the free layer/the tunnel barrier layer/the pinned layer. Then, when a current is flown between the free layer and the pinned layer which sandwich the tunnel barrier layer, a tunnel current in the tunnel barrier layer changes, depending on a relative angle in the magnetizations of the free layer and the pinned layer (TMR effect). The magnetization direction of the pinned layer is fixed, and the magnetization direction of the free layer changes on an external magnetic field. Therefore, when a current or a current change ratio in the TMR element is measured, the external magnetic field can be detected.

The TMR element according to the present invention includes a bias magnetic field-inductive layer to apply a given magnetic field to the free layer. Therefore, Barkhausen noise is removed in the free layer and thus, high quality detection signal can be obtained.

As mentioned above, the TMR element of the present invention includes the first conductive layer and the second conductive layer. The first conductive layer is provided on the one surface of the ferromagnetic tunnel effective film and electrically conducted to the ferromagnetic tunnel effective film. As a result, the first conductive layer functions as an electrode layer and a magnetic shielding layer. The second conductive layer is provided on the other surface of the ferromagnetic tunnel effective film and electrically conducted to the ferromagnetic tunnel effective film. As a result, the second conductive layer also functions as an electrode layer and a magnetic shielding layer. Therefore, a sense current is supplied to the ferromagnetic tunnel effective film 1 from the first conductive layer and the second conductive layer.

At least one of the first conductive layer and the second conductive layer generates a magnetic field having the same direction as that of the bias magnetic field through a sense current therein. As a result, the bias magnetic field to be applied to the free layer is reinforced by the magnetic field from the sense current.

Therefore, even though the magnetic bias means such as a hard magnet and an antiferromagnetic film is reduced in size with the reduction of the area of the TMR element for realizing a high density recording, the bias magnetic field can be applied to the free layer of the ferromagnetic tunnel effective film in sufficient intensity.

This invention relates to an electrode structure to flow a current in the ferromagnetic tunnel effective film and a shielding structure for the ferromagnetic tunnel effective film. Moreover, this invention also relates to a thin film magnetic head including the TMR element as a reading element, a thin film magnetic head device and a magnetic disk drive device which include the thin film magnetic head.

BRIEF DESCRIPTION OF THE DRAWINGS

For a better understanding of this invention, reference is made to the attached drawings, wherein.

DETAILED DESCRIPTION OF PREFERRED EMBODIMENTS

Figure 1:
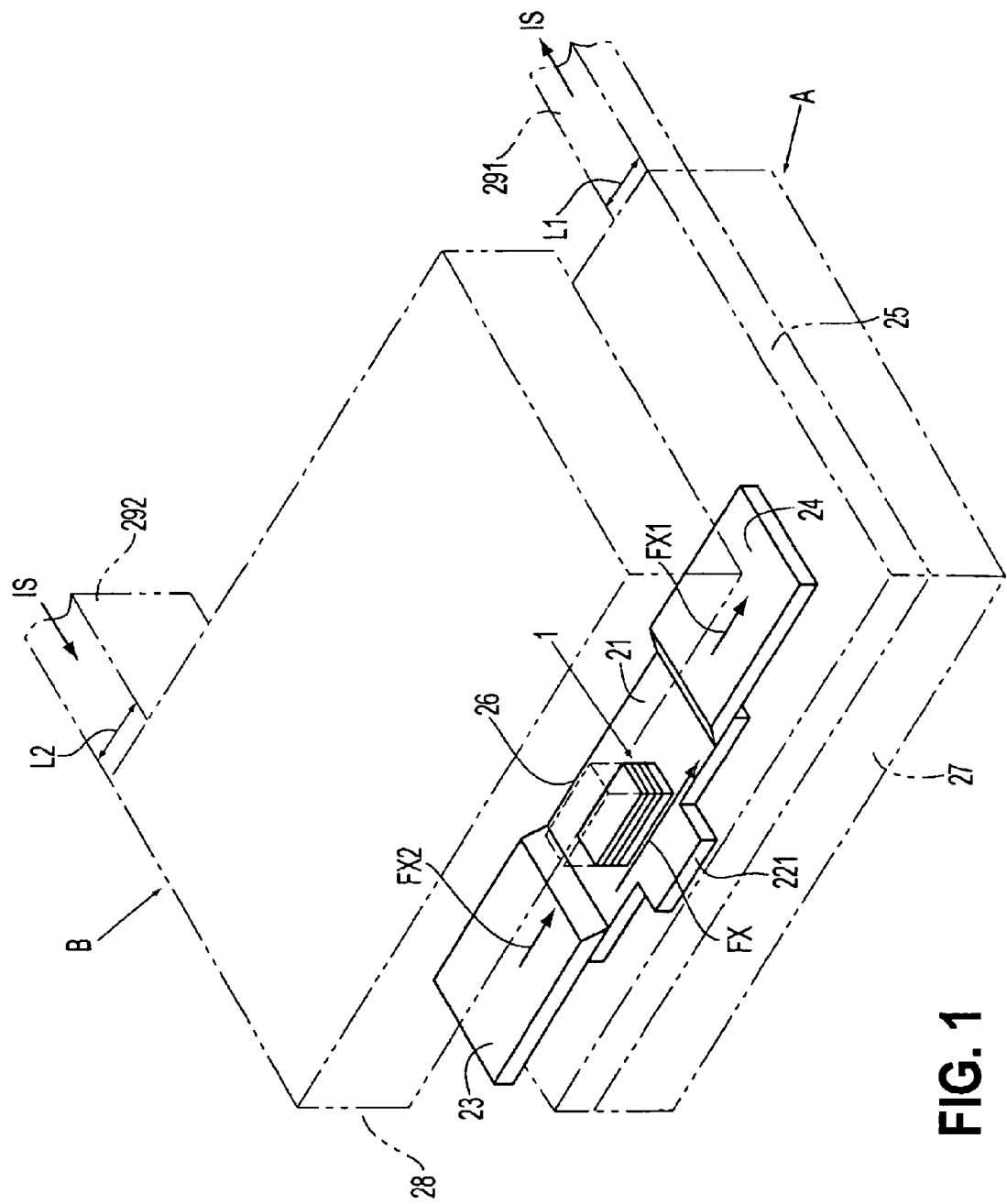
FIG. 1 is a perspective view showing a TMR element according to the present invention.
Figure 2:
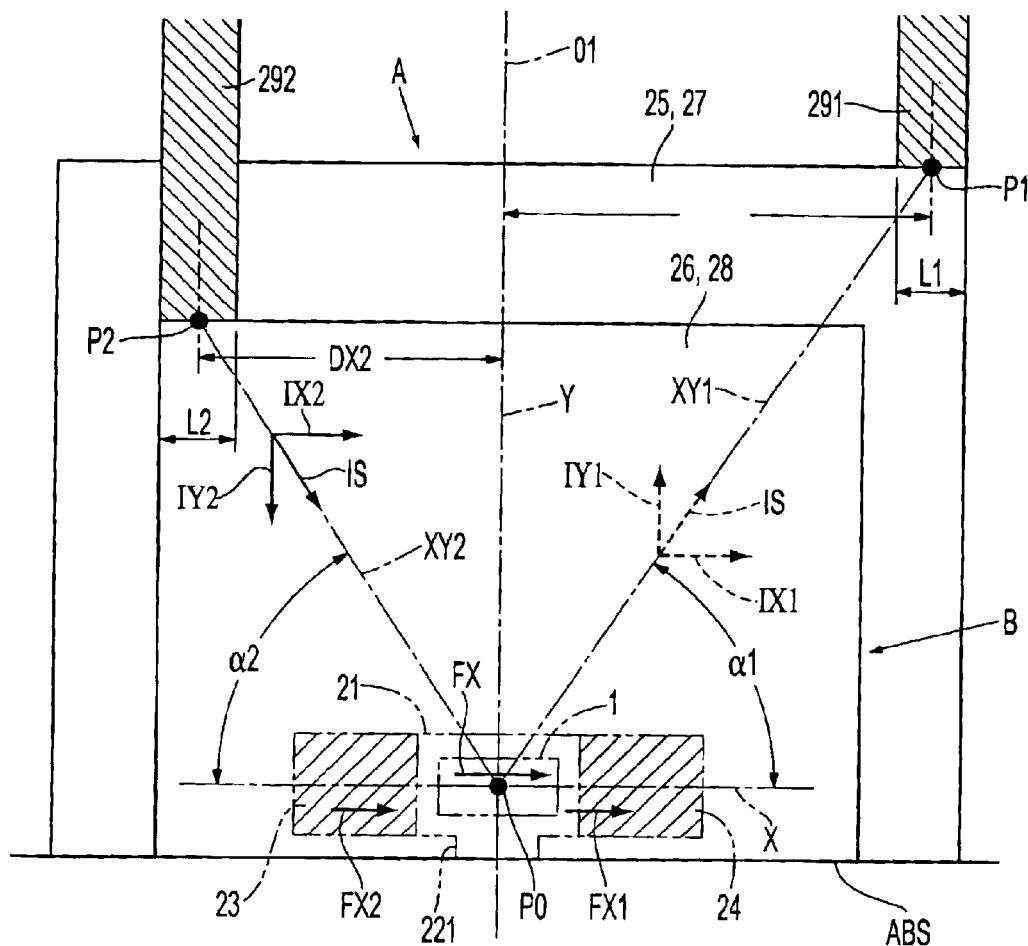
FIG. 2 is a partially enlarged plan view of the TMR element shown in FIG. 1.
Figure 3:
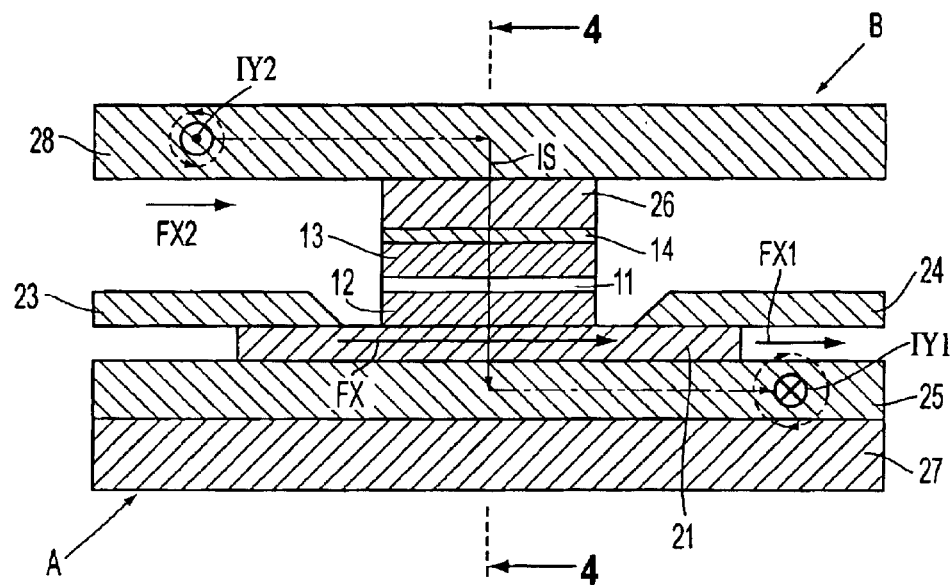
FIG. 3 is a cross sectional view of the TMR element shown in FIGS. 1 and 2 as is viewed from the front side of the TMR element.
Figure 4:
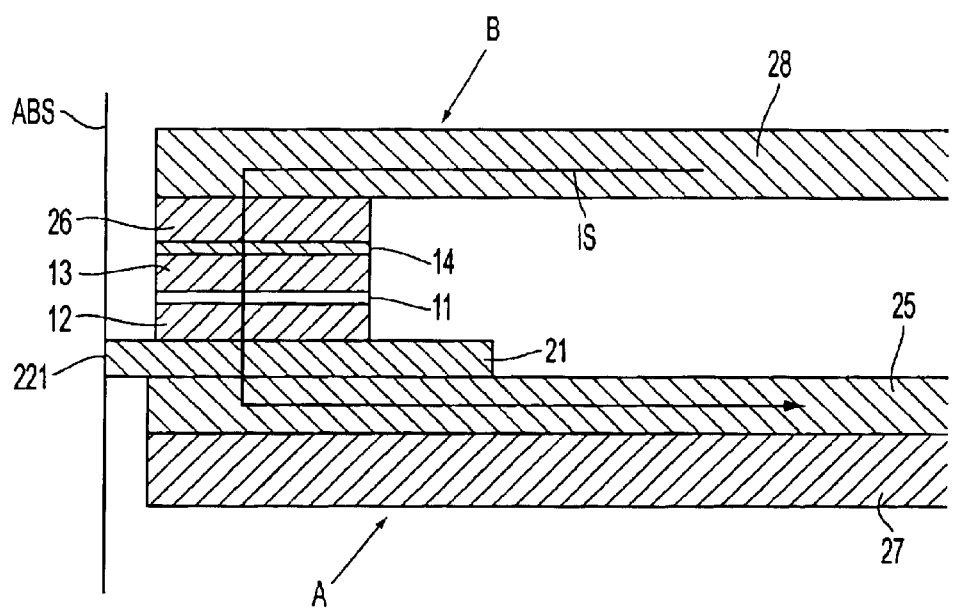
FIG. 4 is a cross sectional view of the TMR element taken on line "4—4" in FIG. 3.

FIG. 1 is a perspective view showing a TMR element according to the present invention, and FIG. 2 is a partially enlarged plan view of the TMR element shown in FIG. 1. FIG. 3 is a cross sectional view of the TMR element shown in FIGS. 1 and 2 as is viewed from the front side of the TMR element, and FIG. 4 is a cross sectional view of the TMR element taken on line "4—4" in FIG. 3. In these figures, some parts of the TMR element are exaggerated for the explicitness of the features of the TMR element of the present invention. The hatched parts designate parts covered with a non-magnetic insulating layer made of a ceramic material.

The depicted TMR element includes a ferromagnetic tunnel effective film 1, a magnetic bias means 21, 23, 24, a first conductive layer A and a second conductive layer B.

Referring to FIGS. 3 and 4, the ferromagnetic tunnel effective film 1 includes a tunnel barrier layer 11, a free layer 12 and a pinned layer 13. The tunnel barrier layer 11 is sandwiched between the free layer 12 and the pinned layer 13.

The magnetization of the free layer 12 is fundamentally rotated on an external magnetic field as a magnetic information. Moreover, the magnetization of the pinned layer 13 is pinned so that it can be aligned in one direction. Therefore, a pinning layer 14 to pin the magnetization of the pinned layer 13 is provided on a surface of the pinned layer 13 opposite to a surface on which the tunnel barrier layer 11 is formed. In this embodiment shown in FIGS. 3 and 4, the free layer 12, the tunnel barrier layer 11 and the pinned layer 13 are stacked in turn.

Not limited, it is desired that the thickness of the free layer is set to 1–8 nm, particularly 1–6 nm, more particularly 1–4 nm. If the thickness of the free layer 12 is set to less than 10 nm, it may be difficult to set the width Lm of the bias magnetic inductive layer 21 to a sufficient value in light of a conventional film-forming technique. If the thickness of the free layer 12 is set beyond 50 nm, the interior properties of the free layer 12 may be fluctuated, so that the electron spin polarizing ratio may be fluctuated and the TMR change ratio may be decreased.

The free layer 12 and the pinned layer 13 are preferably made of a high polarized material such as Fe, Co, Ni, FeCo, NiFe, CoZrNb, FeCoNi. Moreover, the free layer 12 and the pinned layer 13 may be composed of a laminated body made of the above polarized material. The thickness of the free layer 12 is preferably set to 1–8 nm, particularly 1–4 nm. Too thick free layer may reduce the output power of the TMR element, and too thin free layer may destabilize the magnetic properties of the TMR element and thus, increase the noise of the TMR element in the operation of a thin film magnetic head with the TMR element. The thickness of the pinned layer 13 is set to 1–10 nm, particularly 2–5 nm. Too thick pinned layer may weaken the pining effect of a pinning layer 14, and too thin pinned layer may reduce the TMR change ratio.

The pining layer 14 to pin the magnetization of the pinned layer 13 may be made of any material only if it can exhibit its pinning effect for the pinned layer 13 in nature, but it may be preferably made of an antiferromagnetic material. Moreover, the thickness of the pinning layer 14 is set to 60–5 nm.

The tunnel barrier layer 11 may be made of $Al_2O_3$, NiO, GdO, MgO, $Ta_2O_5$, $MoO_2$, $TiO_2$, $WO_2$, etc. It is desired that the tunnel barrier layer 11 is formed as thin as possible in order to reduce the resistance of the TMR element. However, if the tunnel barrier 11 is formed too thin, much pin hole may be formed therein, causing a leak current. As a result, the thickness of the tunnel barrier layer 11 is set to within 0.5–2 nm.

In a preferred embodiment, the free layer 12 is made of a synthetic ferrimagnet composed of the three-layered body of a 2 nm thickness NiFe layer/a 0.7 nm thickness Ru layer/a 2.5 nm thickness NiFe layer. In this case, the magnetization direction of the upper NiFe layer is reverse to that of the lower NiFe layer. In the use of the synthetic ferrimagnet, since the free layer 12 can be formed thin, the magnetic field sensitivity of the TMR element can be enhanced and thus, the output power of the TMR element can be increased. Such a ferrimagnet may be used for the pinned layer 13.

In the ferromagnetic tunnel effective film 1, when a sense current IS is flown between the free layer 12 and the pinned layer 13 sandwiching the tunnel barrier layer 11, a tunnel current in the tunnel barrier layer 11 is changed on the relative angle between the magnetizations of the free layer 12 and the pinned layer 13. Since the magnetization direction of the pinned layer 13 is fixed, the magnetization direction of the free layer 12 is changed on a external magnetic field. Therefore, when a current or a current change ratio is measured, the external magnetic field can be detected.

The magnetic bias means 21, 23, 24 are provided for applying a bias magnetic field FX to the free layer 12. In this embodiment, the magnetic bias means 21 is composed of the bias magnetic field-inductive layer 21. The ferromagnetic tunnel effective film 1 is provided on one surface of the bias magnetic field-inductive layer 21. In the ferromagnetic effective film of this embodiment, the free layer 12, the tunnel barrier layer 11 and the pinned layer 13 are stacked in turn, and the free layer 12 is contacted to the one surface of the bias magnetic field-inductive layer 21. The width of the bias magnetic field-inductive layer as viewed from the direction X the bias magnetic field FX is larger than that of the ferromagnetic tunnel effective film 1.

The magnetic bias applying means 23 and 24 are provided on both ends of the bias magnetic field-inductive layer 21, separated from both ends of the ferromagnetic tunnel effective film 1 by given distances, as is viewed from the direction X of the bias magnetic field FX. The bias magnetic field FX generated from the magnetic bias applying means 23 and 24 is applied to the free layer 12 via the bias magnetic field-inductive layer 21. The magnetic bias applying means 23 and 24 is made of a high coercive force material, an antiferromagnetic material, or a laminated body of an antiferromagnetic layer and at least one ferromagnetic layer.

The first conductive layer A is provided on one surface side of the ferromagnetic tunnel effective film 1, and thus, electrically conducted to the ferromagnetic tunnel effective film 1. The second conductive layer B is provided on the other surface side of the ferromagnetic tunnel effective film 1, and thus, electrically conducted to the ferromagnetic tunnel effective film 1. Therefore, the sense current IS is supplied to the ferromagnetic tunnel effective film 1 through the first conductive layer A and the second conductive layer B.

In the ferromagnetic tunnel effective film 1 of this embodiment, the free layer 12, the tunnel barrier layer 11, the pinned layer 13 and the pining layer 14 are stacked in turn, and the first conductive layer A is provided so as to contact to the bias magnetic field-inductive layer 21 contacting to the free layer 12, and the second conductive layer B is provided so as to contact the pinning layer 14.

At least one of the first conductive layer A and the second conductive layer B generates a magnetic field FX1 or FX2 having the same direction as that of the bias magnetic field FX by the sense current therein. Therefore, the bias magnetic field FX to be applied to the free layer 12 can be reinforced by the magnetic field FX1 or FX2 generated by the sense current IS in the first conductive layer A and the second conductive layer B.

As a result, even though for realizing a high density recording, the hard magnet and the antiferromagnetic film is reduced in size with the reduction of the area of the TMR element, the bias magnetic field FX can be applied to the free layer 12 in large intensity.

In this embodiment, both of the first conductive layer A and the second conductive layer B generate the magnetic fields FX1 and FX2 having the same direction as that of the bias magnetic field FX by the sense current IS therein. Therefore, the bias magnetic field FX to be applied to the free layer 12 is reinforced by the magnetic fields FX1 and FX2 generated by the sense current IS in the first conductive layer A and the second conductive layer B.

Referring to FIGS. 2–4, the generation mechanism of the magnetic fields FX1 and FX2 from the sense current IS on the basis of the concrete structure of the TMR element. Since FIG. 2 is a plan view of the TMR element shown in FIG. 1, the three-dimensional TMR element depicted in FIG. 1 is represented as a plane projection in FIG. 2. For example, references "X", "Y", "XY1", "XY2", "IX1", "IX2", "IY1", "IY2", "DX1", "DX2", α1, α2, etc. designate planer projected parts of the TMR element. Hereinafter, all of the above references will designate the planer projected parts.

In FIGS. 2–4, the first conductive layer A includes a first electrode/magnetic shielding portion 25 and 27 and a first leading electrode portion 291. The first electrode/magnetic shielding portion 25 and 27 includes an electrode layer 25 and a magnetic shielding layer 27. One surface of the electrode layer 25 is contacted to the other surface of the bias magnetic field-inductive layer 21, and the other surface of the electrode layer 25 is contacted to one surface of the magnetic shielding layer 27. Therefore, the first conductive layer A functions as a given electrode layer and a given magnetic shielding layer.

The second conductive layer B also includes a second electrode/magnetic shielding portion 26 and 28 and a second leading electrode portion 292. The second electrode/magnetic shielding portion 26 and 28 includes an electrode layer 26 and a magnetic shielding layer 28. Then, one surface of the electrode layer 26 is contacted to one surface of the pining layer 14, and the other surface of the electrode layer 27 is contacted to one surface of the magnetic shielding layer 28. Therefore, the second conductive layer functions as a given electrode layer and a given magnetic shielding layer.

The first leading electrode portion 291 is electrically joined with the electrode layer 25 constituting the first electrode/magnetic shielding portion 25 and 27. Concretely, the first leading electrode portion 291 is electrically joined with a part of the first electrode/magnetic shielding portion 25 and 27 at the position in which the sense current IS in the first electrode/magnetic shielding portion 25 and 27 generates the magnetic field FX1 having the same direction as that of the bias magnetic field FX.

More concretely, the first leading electrode portion 291 is electrically joined, so as to have a boundary length L1 having its width sufficiently shorter than that of the first electrode/magnetic shielding portion 25 and 27, with a part of an upper edge area of the first electrode/magnetic shielding portion 25 and 27, at the position separated from the center line Y of the ferromagnetic tunnel effective film 1 orthogonal to the direction X of the bias magnetic field FX by a distance DX1 in the direction X of the bias magnetic field FX. The first leading electrode portion 291 may be integrated with the first electrode/magnetic shielding portion 25 and 27 or may be formed of another film different from the first electrode/magnetic shielding portion 25 and 27. The distance DX1 is defined as a projected planer distance, as mentioned above.

In this case, the line segment XY1 between the first center point P1 of the boundary line L1 and a center point P0 positioned in the ferromagnetic tunnel effective film 1 is crossed to the line segment in the direction X of the bias magnetic field FX by a planer angle $\alpha 1$. In this case, the "planer angle" means an angle between 0 degree and 90 degrees. That is, the planer angle $\alpha 1$ is set to within 0–90 degrees.

If the sense current Is is flown along the line segment XY1 (shortest distance) between the first center point P1 and the center point P0 of the ferromagnetic effective film 1, it is divided into a current component IX1 in a X-direction parallel to the bias magnetic field FX and a current component IY1 in a Y-direction perpendicular to the bias magnetic field FX. As shown in FIG. 3, the current component IY1 generates a magnetic field FX1 parallel to the bias magnetic field FX. Therefore, the bias magnetic field FX to be applied to the free layer 12 can be reinforced by the magnetic field FX1.

In this embodiment, the second leading electrode portion 292 is electrically joined with the second electrode/magnetic shielding portion 26 and 28. Concretely, the second leading electrode portion 292 is electrically joined with a part of the second electrode/magnetic shielding portion 26 and 28 at the position in which the sense current IS in the second electrode/magnetic shielding portion 26 and 28 generates the magnetic field FX2 having the same direction as that of the bias magnetic field FX.

More concretely, the second leading electrode portion 292 is electrically joined, so as to have a boundary length L2 having its width sufficiently shorter than that of the second electrode/magnetic shielding portion 26 and 28, with a part of the second electrode/magnetic shielding portion 26 and 28, at the position separated from the center line Y of the ferromagnetic tunnel effective film 1 orthogonal to the direction X of the bias magnetic field FX by a distance DX2 in the direction X of the bias magnetic field FX. The second leading electrode portion 292 may be integrated with the second electrode/magnetic shielding portion 26 and 28 or may be formed of another film different from the first electrode/magnetic shielding portion 26 and 28.

In this case, the line segment XY2 between the second center point P2 of the boundary line L2 and the center point P0 positioned in the ferromagnetic tunnel effective film 1 is crossed to the line segment in the direction X of the bias magnetic field FX by a planer angle $\alpha 2$.

If the sense current Is is flown along the line segment XY2 (shortest distance) between the first center point P2 and the center point P0 of the ferromagnetic effective film 1, it is divided into a current component IX2 in the X-direction parallel to the bias magnetic field FX and a current component IY2 in the Y-direction perpendicular to the bias magnetic field FX. As shown in FIG. 3, the current component IY2 generates a magnetic field FX2 parallel to the bias magnetic field FX. Therefore, the bias magnetic field FX to be applied to the free layer 12 can be reinforced by the magnetic field FX2. The planer angles $\alpha 1$ and $\alpha 2$ are preferably set to 5 degrees or over.

The first leading electrode portion 291 may be joined with any part of the first electrode/magnetic shielding portion 25 and 27 only if the sense current IS in the first conductive layer A can generate the magnetic field FX1 having the same direction as that of the bias magnetic field FX, and the second leading electrode portion 292 may be joined with any part of the first electrode/magnetic shielding portion 26 and 28 only if the sense current IS in the second conductive layer B can generate the magnetic field FX2 having the same direction as that of the bias magnetic field FX. In this embodiment shown in FIGS. 1–4, the first leading electrode portion 291 and the second leading electrode portion 292 are provided in both sides of the center line Y, respectively. In this case, as is apparent from the above mention, the magnetic fields FX1 and FX2 are generated from the sense current IS in the first conductive layer A and the second conductive layer B, respectively.

Since the TMR element depicted in FIGS. 1–4 includes the bias magnetic field-inductive layer 21 to apply the bias magnetic field to the free layer 12, it can remove Barkhausen noise in the free layer 12 and obtain high quality detection signal. Since the bias magnetic field-inductive layer 21 is wider than the ferromagnetic tunnel effective film 1 as viewed from the bias magnetic field direction FX, it can have the magnetic bias applying means 23 and 24 on both edges thereof separating from the ferromagnetic tunnel effective film 1 by a given distance. Therefore, the magnetic bias applying means 23 and 24 can not cause electric short circuit between the free layer 12 and the pinned layer 13.

It is desired that the distance between the ferromagnetic tunnel effective film 1 and the magnetic bias applying means 23 and 24 is set to a given range so as not to degrade the TMR change ratio substantially. For example, the distance is set to 0.02 $\mu$m or over, particularly to a range within 0.02–0.3 $\mu$m, more particularly to a range not less than 0.02 $\mu$m and less than 0.15 $\mu$m.

If the distance is less than 0.02 $\mu$m, the TMR change ratio is likely to be decreased. On the contrary, if the distance is more than 0.3 μm, an effective track width is widened and thus, a future high density recording may not be realized.

Although in this embodiment, the magnetic bias applying means 23 and 24 are provided on both edges of the bias magnetic field-inductive layer 21, they may be provided under the both edges.

Moreover, one end of the bias magnetic field-inductive layer 21 constitutes a flux probe portion 221 projecting from the bias magnetic field-inductive layer 21. An external magnetic field is introduced into the bias magnetic field-inductive layer 21 from the flux probe portion 221, and applied to the free layer 12. Therefore, in the case of fabricating a thin film magnetic head of the above TMR element, the ferromagnetic tunnel effective film 1 may be receded from an air bearing surface of the thin film magnetic head by positioning the flux probe portion 221 at the air bearing surface. As a result, during or after the polishing step for the air bearing surface, an electrical short circuit in the tunnel barrier layer can be prevented.

The flux probe portion 221 has a narrower width than that of the bias magnetic field-inductive layer 21, and is projecting from the ends of the bias magnetic field-inductive layer 21. Therefore, when the TMR element is employed as a reading element of a thin film magnetic head, the reproducing track width of the magnetic head is defined by the narrow width of the flux probe portion 221.

The width of the ferromagnetic tunnel effective film 1 is equal to or larger than that of the flux probe portion 221 and smaller than that of the bias magnetic field-inductive layer 21. The width of the bias magnetic field-inductive layer 21 is set within 0.5–4 μm, and the width of the flux probe portion 221 is set within 0.1–2 μm.

The projecting length of the flux probe portion 221 is set within 0.01–0.3 μm, preferably within 0.01–0.2 μm, more preferably 0.01–0.1 μm. Although it is desired that the projecting length is diminished up to zero, electrostatic destruction may occur and electric short circuit may occur in polishing step as the projecting length is diminished. Therefore, the lower limited value of the projecting length is preferably set to 0.01 μm. If the lower limited value of the projecting length is set beyond 0.3 μm, the output power of the TMR element may be decreased and Barkhausen noise may occur in the TMR element due to the insufficient bias magnetic field FX in the bias magnetic field direction X.

Figure 5:
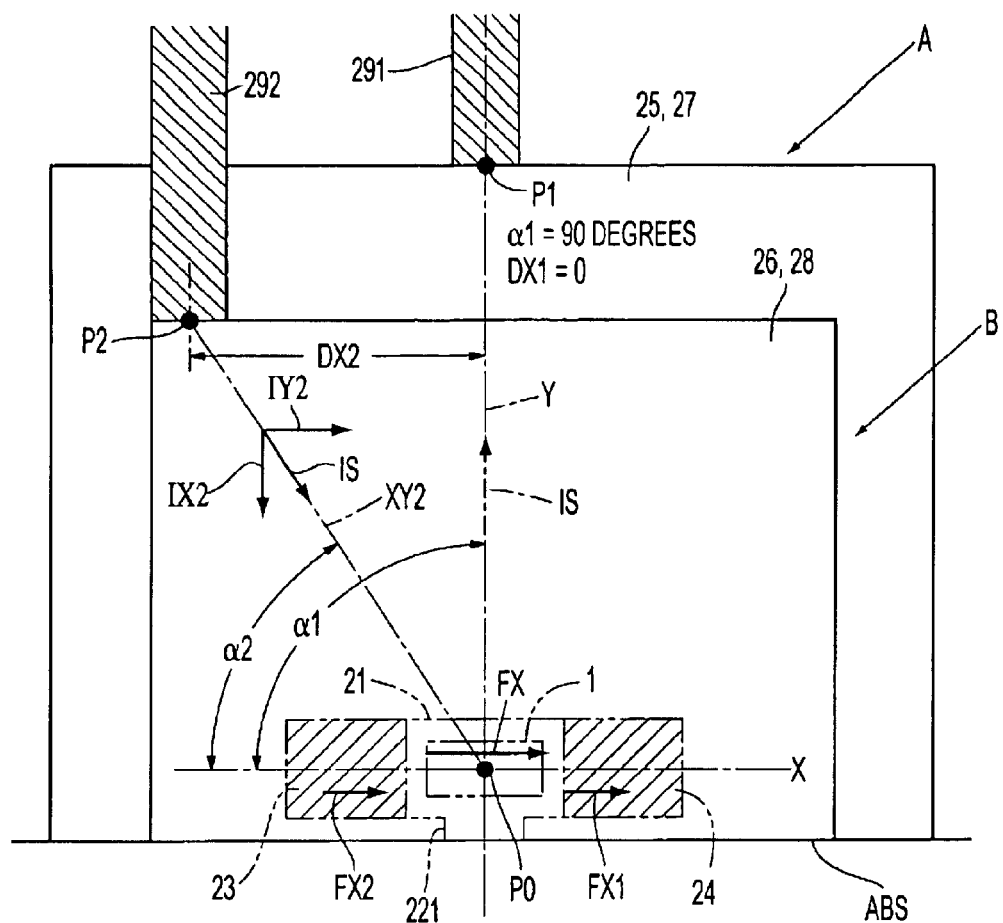
FIG. 5 is a plan view showing another arrangement of the first leading electrode and the second leading electrode of the TMR element shown in FIGS. 1 and 2.

FIG. 5 is a plan view showing another arrangement of the first leading electrode portion 291 and the second leading electrode portion 292. In FIG. 5, the same references are given to the similar components to the ones depicted in FIG. 2. In this embodiment, the first leading electrode portion 291 is positioned so that the planer angle α1 is set to 90 degrees and the distance DX1 is set to zero. The second leading electrode portion 291 is positioned as shown in FIG. 2. In this case, the first conductive layer A and the second conductive layer B generate the magnetic fields FX1 and FX2 in the X-direction having the same direction as that of the bias magnetic field FX, respectively.

Figure 6:
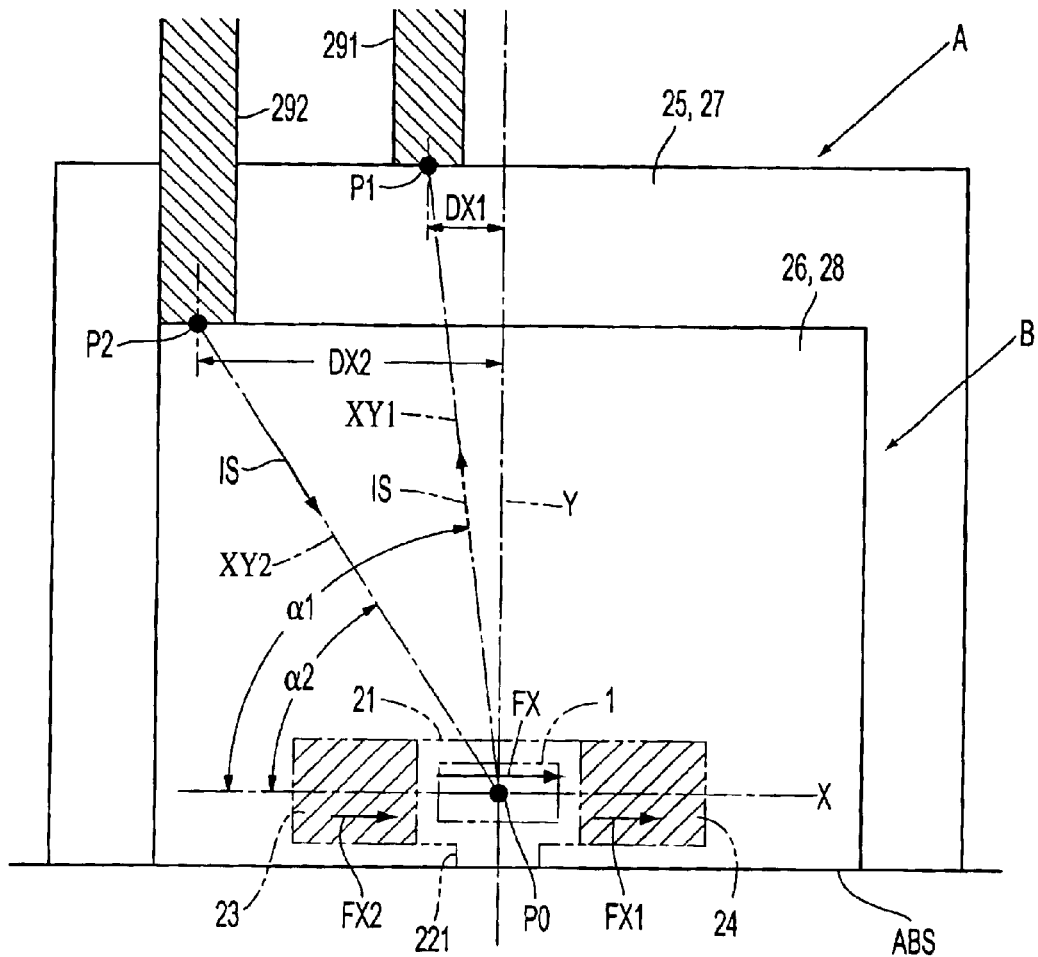
FIG. 6 is a plan view showing still another arrangement of the first leading electrode and the second leading electrode of the TMR element shown in FIGS. 1 and 2.

FIG. 6 is a plan view showing still another arrangement of the first leading electrode portion 291 and the second leading electrode portion 292. In FIG. 6, the same references are given to the similar components to the ones depicted in FIG. 2. In this embodiment, both of the first leading electrode portion 291 and the second leading electrode portion 292 are provided in either side from the center line Y (left side in FIG. 6). In this case, the first conductive layer A and the second conductive layer B generate the magnetic fields FX1 and FX2 in the X-direction having the same direction as that of the bias magnetic field FX, respectively.

Figure 7:
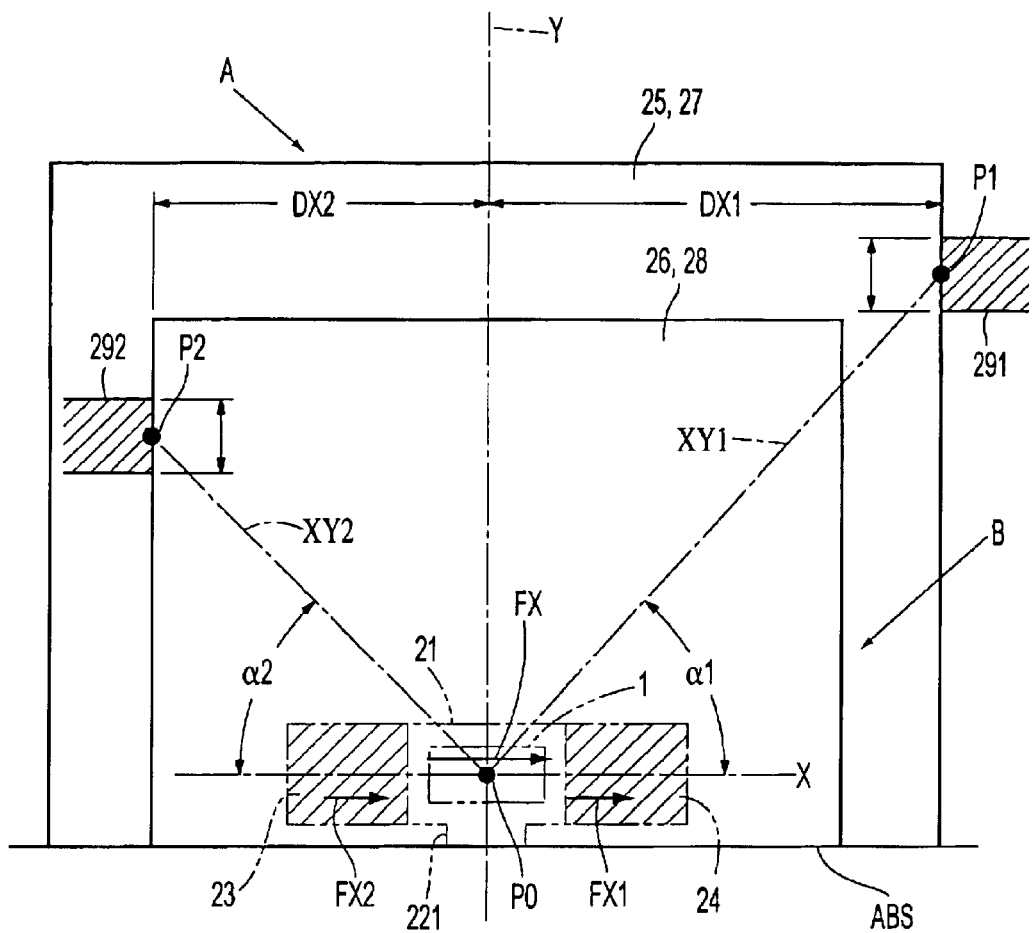
FIG. 7 is a plan view showing a further arrangement of the first leading electrode and the second leading electrode of the TMR element shown in FIGS. 1 and 2.

FIG. 7 is a plan view showing a further arrangement of the first leading electrode portion 291 and the second leading electrode portion 292. In FIG. 7, the same references are given to the similar components to the ones depicted in FIG. 2. In this embodiment, the first leading electrode portion 291 is electrically joined with a part of the first conductive layer A in the direction X of the bias magnetic field FX, and the second leading electrode portion 292 is electrically joined with a part of the second conductive layer B in the direction X of the bias magnetic field FX. That is, the first leading electrode portion 291 and the second leading electrode portion 292 are joined with the side surfaces of the first conductive layer A and the second conductive layer B. The joining positions of the first leading electrode portion 291 and the second leading electrode portion 292 may be moved along the side surfaces of the first conductive layer A and the second conductive layer B. In this case, if the planer angles α1 and α2 is set to a range more than zero, preferably a range not less than 5 degrees, the sense current IS in the first conductive layer A and the second conductive layer B can generate the magnetic fields FX1 and FX2 having the same direction as that of the bias magnetic field FX.

It is obvious that various arrangements may be employed for the first leading electrode portion 291 and the second leading electrode portion 292 in addition to the ones shown in FIGS. 1–7.

Figure 8:
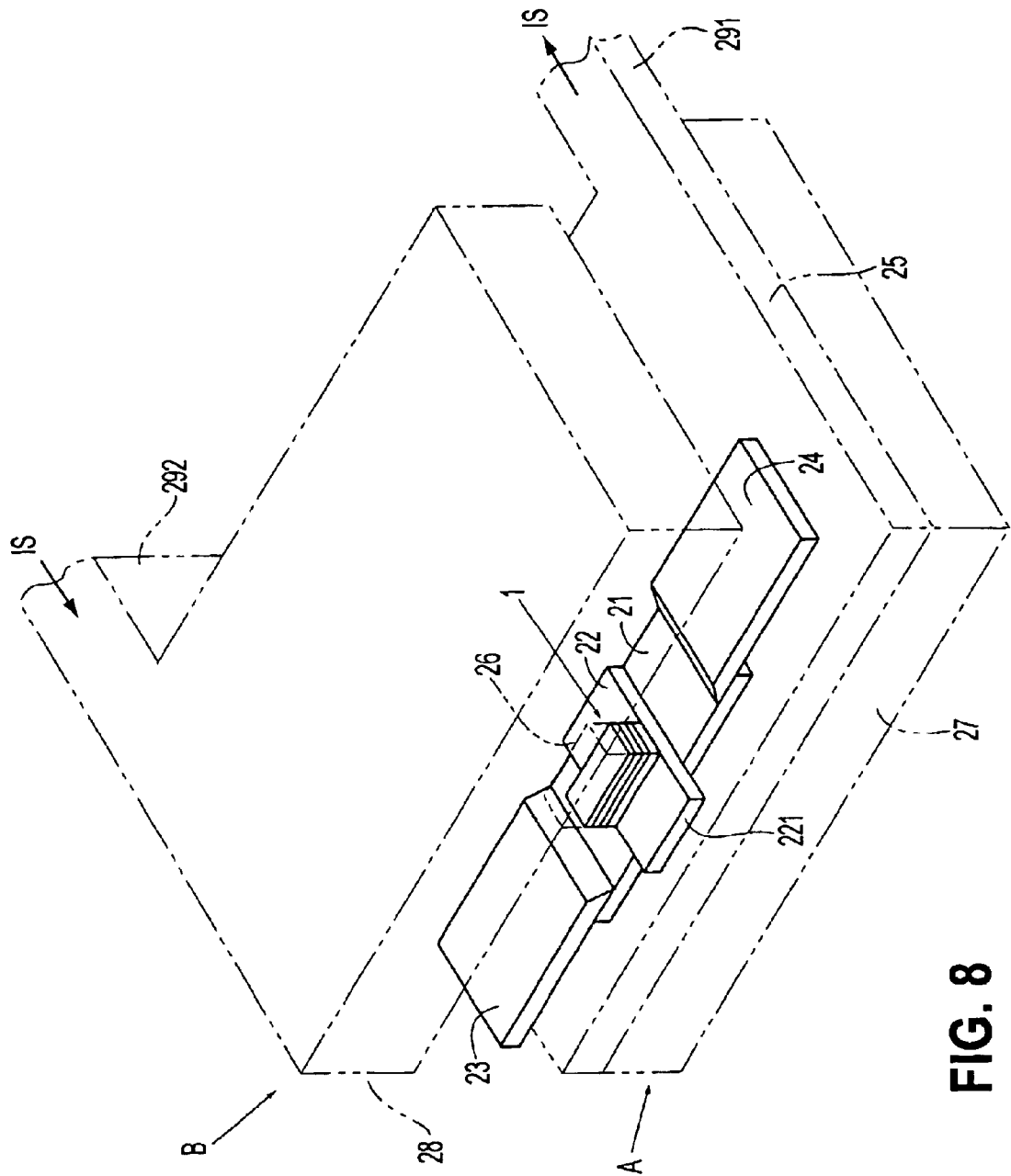
FIG. 8 is a perspective view showing another TMR element according to the present invention.
Figure 9:
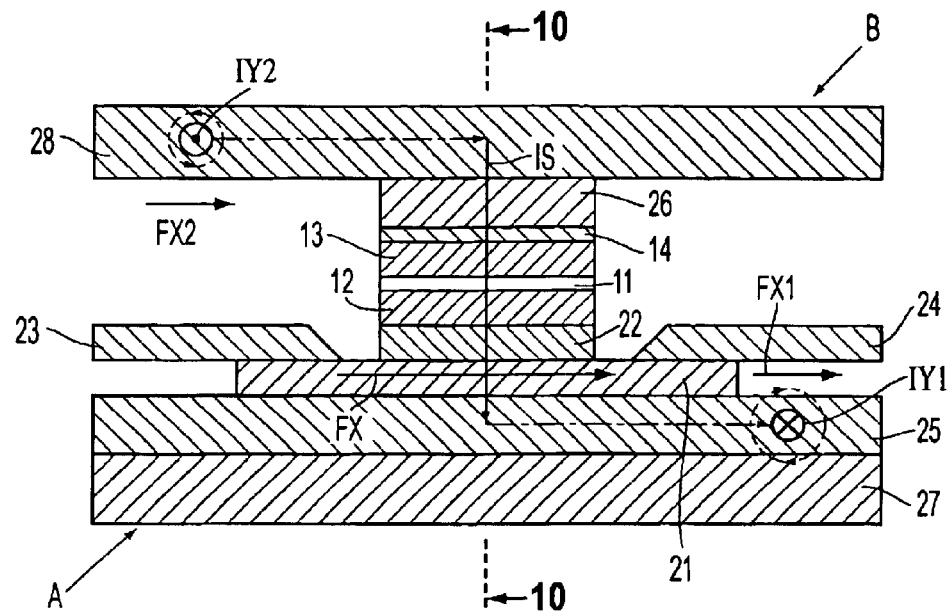
FIG. 9 is a partially enlarged plan view of the TMR element shown in FIG. 8.
Figure 10:
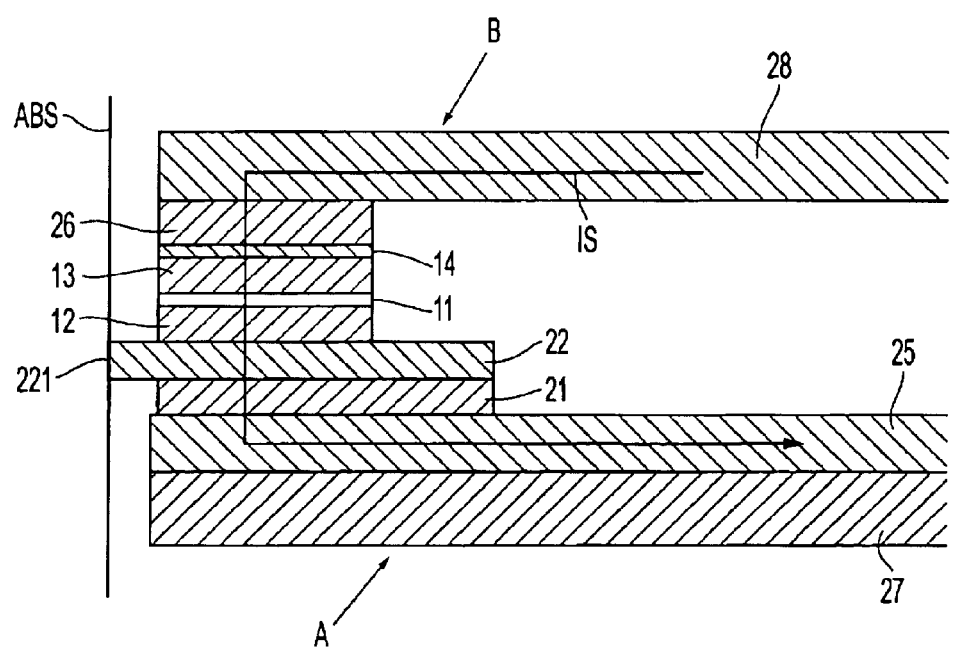
FIG. 10 is a cross sectional view of the TMR element taken on line "10—10" in FIG. 9.

FIG. 8 is a perspective view showing another TMR element according to the present invention, and FIG. 9 is a partially enlarged plan view of the TMR element shown in FIG. 8, and FIG. 10 is a cross sectional view of the TMR element taken on line "10—10" in FIG. 9. In these figures, the same references are given to the similar parts to the ones shown in FIGS. 1–3. A TMR element depicted in FIGS. 8–10 includes a flux guide layer 22 magnetically connected to the free layer 12, and one end of the flux guide layer 22 constitutes the flux probe portion 221 projecting from the ends of the bias magnetic field-inductive layer 21. An external magnetic field is introduced from the flux probe portion 221 and applied to the free layer 12 through the flux guide layer 22. Therefore, in building the TMR element in a thin film magnetic head, the flux probe portion 221 can be positioned at an air bearing surface, and the ferromagnetic tunnel effective film 1 can be receded from the air bearing surface. Therefore, during or after polishing step for the air bearing surface, an electric short circuit can not be caused in the tunnel barrier layer 11.

The flux probe portion 221 has a narrower width than that of the bias magnetic field-inductive layer 21 in the bias magnetic field direction, and is projecting from the ends of the bias magnetic field-inductive layer. Therefore, when the TMR element is employed as a reading element of a thin film magnetic head, the reproducing track width of the magnetic head is defined by the narrow width of the flux probe portion.

Moreover, since the flux guide layer 22 is formed with separated from the bias magnetic field-inductive layer 21, it may be formed in another film-forming step.

The longitudinal direction of the flux guide layer 22 is crossed to the direction X of the bias magnetic field direction FX of the bias magnetic field-inductive layer 21, and the one end of the flux guide layer 22 constitutes the flux probe portion 221. Therefore, even though a corner portion of the flux guide layer 22 is etched and thus, made round, the rounded corner may be removed and then, the not etched center portion of the flux guide layer 22 can be employed as the flux probe portion 221. As a result, the TMR element having precise reading track width can be provided.

In this embodiment shown in FIGS. 8–10, the first leading electrode portion 291 is electrically joined with a part of the first electrode/magnetic shielding portion 25 and 27 at the position in which the sense current IS in the first electrode/magnetic shielding portion 25 and 27 generates the magnetic field FX1 having the same direction as that of the bias magnetic field FX. Then, the second leading electrode portion 292 is electrically joined with a part of the second electrode/magnetic shielding portion 26 and 28 at the position in which the sense current IS in the second electrode/magnetic shielding portion 26 and 28 generates the magnetic field FX2 having the same direction as that of the bias magnetic field FX. As a result, the bias magnetic field FX to be applied to the free layer can be reinforced by the magnetic fields FX1 and FX2.

Figure 11:
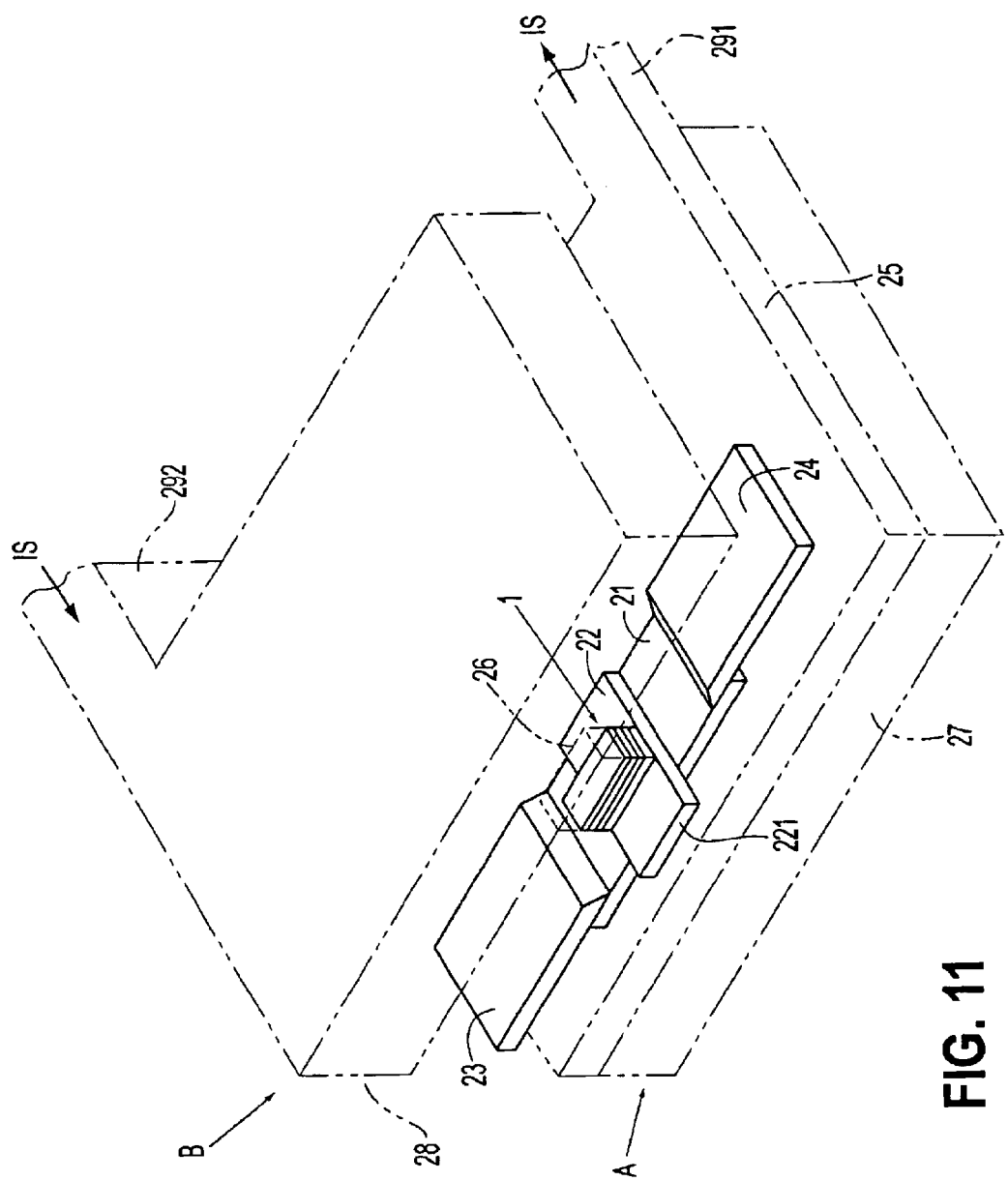
FIG. 11 is a perspective view showing still another TMR element according to the present invention.
Figure 12:
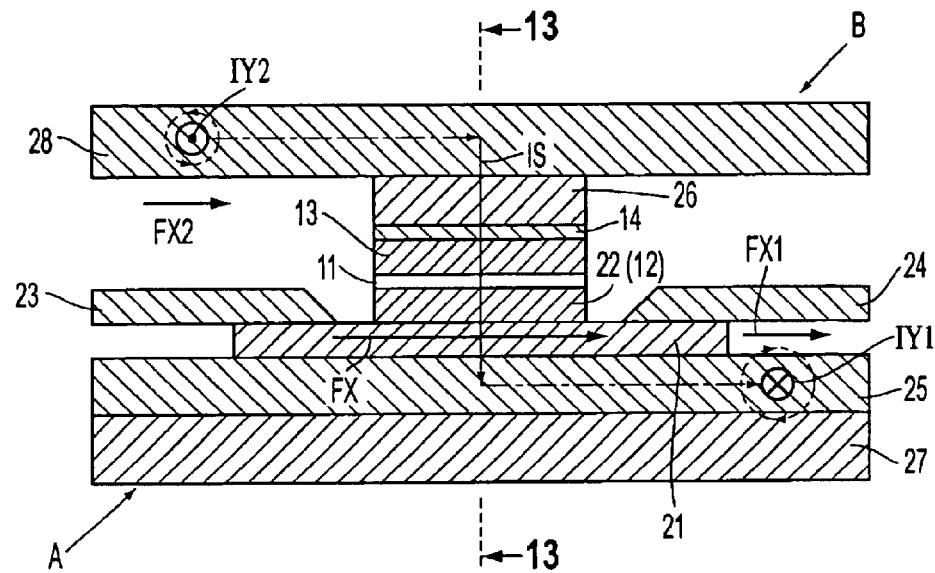
FIG. 12 is a cross sectional view of the TMR element shown in FIG. 11 as is viewed from the front side of the TMR element.
Figure 13:
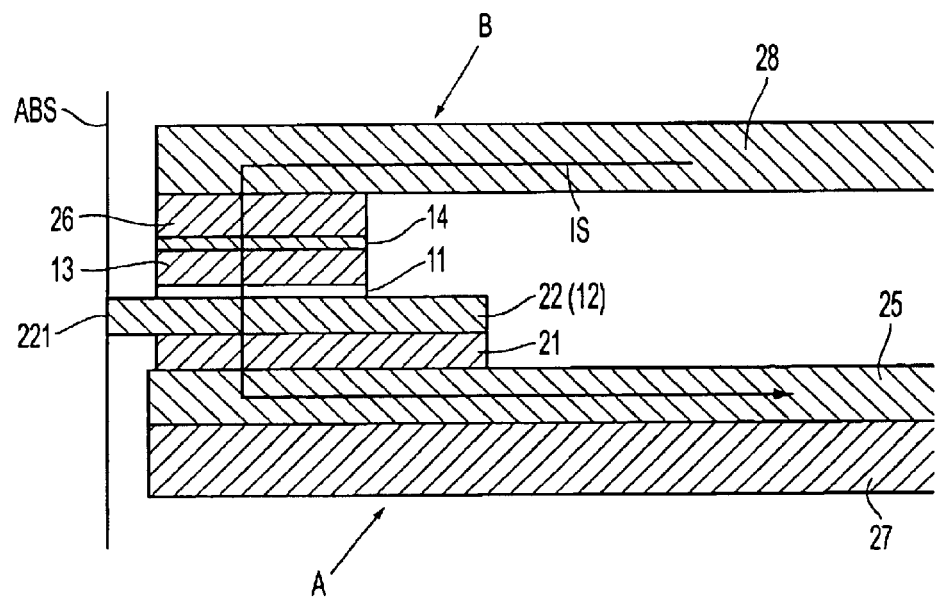
FIG. 13 is a cross sectional view of the TMR element taken on line "13—13" in FIG. 12.

FIG. 11 is a perspective view showing still another TMR element according to the present invention, and FIG. 12 is a cross sectional view of the TMR element shown in FIG. 11 as is viewed from the front side of the TMR element, and FIG. 13 is a cross sectional view of the TMR element taken on line "13—13" in FIG. 12. In these figures, the same references are given to the similar parts to the ones shown in FIGS. 1–3. In the TMR element of this embodiment, the free layer 12, the tunnel barrier layer 11 and the pinned layer 13 are stacked in turn. The flux guide layer 22 is integrated with the free layer 12, and is formed in separation on the bias magnetic field-inductive layer 21.

The first leading electrode portion 291 is electrically joined with a part of the first electrode/magnetic shielding portion 25 and 27 at the position in which the sense current IS in the first electrode/magnetic shielding portion 25 and 27 generates the magnetic field FX1 having the same direction as that of the bias magnetic field FX.

Then, the second leading electrode portion 292 is electrically joined with a part of the second electrode/magnetic shielding portion 26 and 28 at the position in which the sense current IS in the second electrode/magnetic shielding portion 26 and 28 generates the magnetic field FX2 having the same direction as that of the bias magnetic field FX. As a result, the bias magnetic field FX to be applied to the free layer can be reinforced by the magnetic fields FX1 and FX2.

Figure 14:
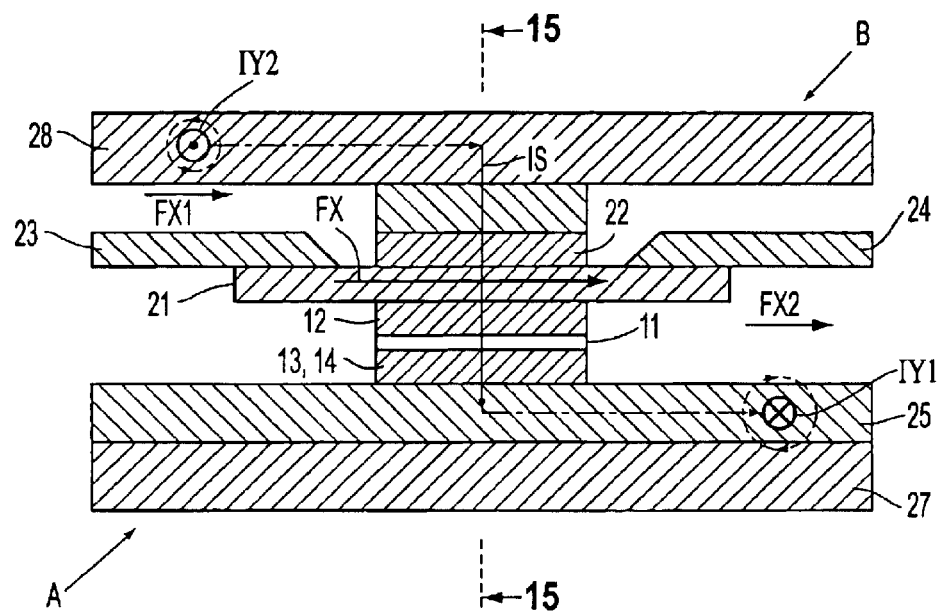
FIG. 14 is a cross sectional view of a further TMR element according to the present invention as is viewed from the front side of the TMR element.
Figure 15:
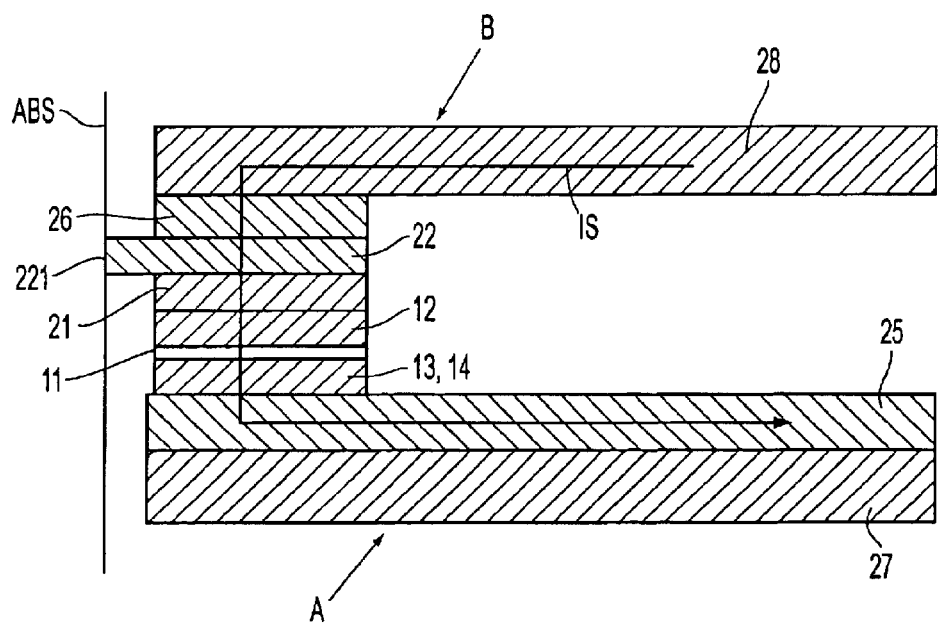
FIG. 15 is a cross sectional view of the TMR element taken on line "15—15" in FIG. 14.

FIG. 14 is a cross sectional view of a further TMR element according to the present invention as is viewed from the front side of the TMR element, and FIG. 15 is a cross sectional view of the TMR element taken on line "15—15" in FIG. 14. In these figures, the same references are given to the similar parts to the ones shown in FIGS. 1–3. In the TMR element of this embodiment, the pinned layer 13, the tunnel barrier layer 11 and the free layer 12 are stacked in turn. The bias magnetic field-inductive layer 21 is adjacent to the free layer 12, and the flux guide layer 22 is stacked in separation on the bias magnetic field-inductive layer 21.

The first leading electrode portion 291 is electrically joined with a part of the first electrode/magnetic shielding portion 25 and 27 at the position in which the sense current IS in the first electrode/magnetic shielding portion 25 and 27 generates the magnetic field FX1 having the same direction as that of the bias magnetic field FX.

Then, the second leading electrode portion 292 is electrically joined with a part of the second electrode/magnetic shielding portion 26 and 28 at the position in which the sense current IS in the second electrode/magnetic shielding portion 26 and 28 generates the magnetic field FX2 having the same direction as that of the bias magnetic field FX. As a result, the bias magnetic field FX to be applied to the free layer can be reinforced by the magnetic fields FX1 and FX2.

Figure 16:
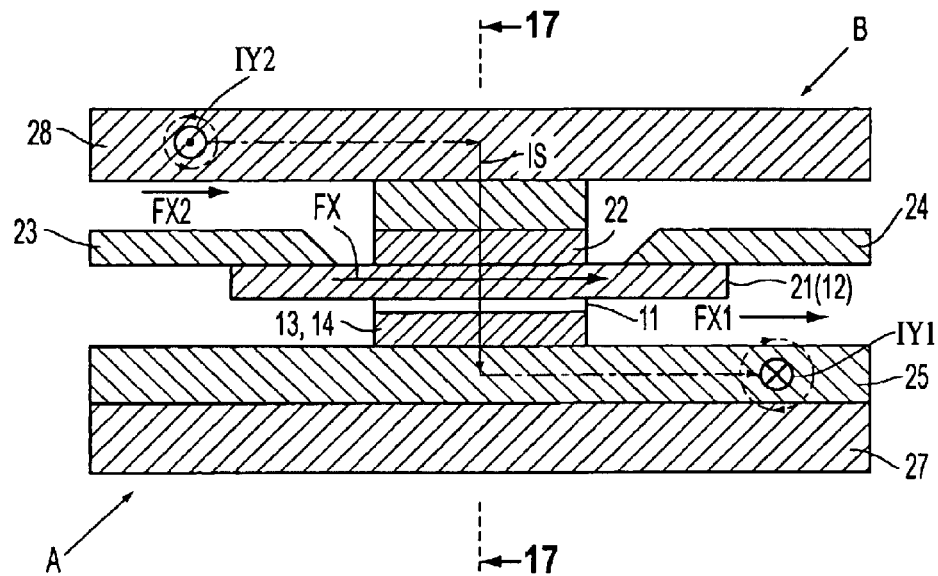
FIG. 16 is a cross sectional view of a still further TMR element according to the present invention as is viewed from the front side of the TMR element.
Figure 17:
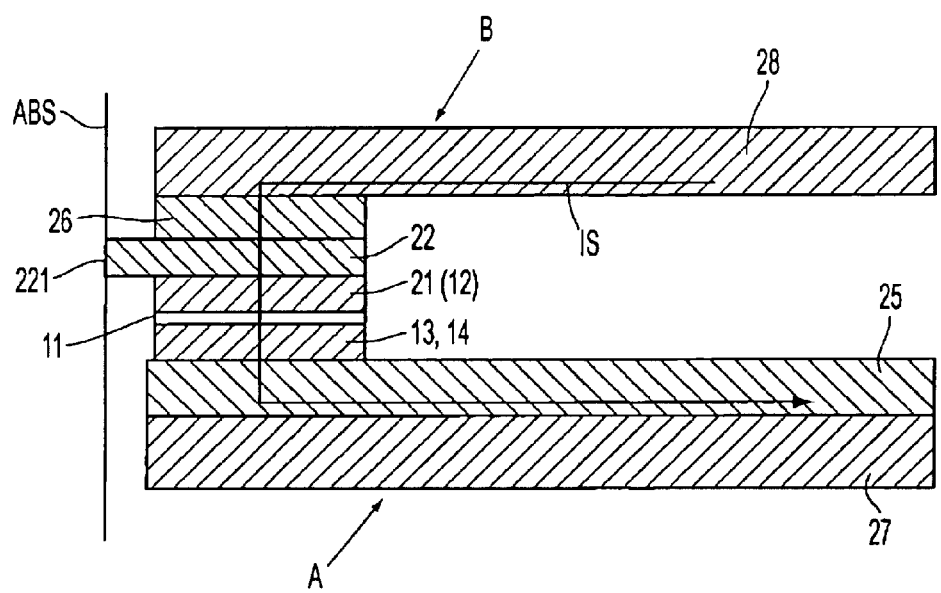
FIG. 17 is a cross sectional view of the TMR element taken on line "17—17" in FIG. 16.

FIG. 16 is a cross sectional view of a still further TMR element according to the present invention as is viewed from the front side of the TMR element, and FIG. 17 is a cross sectional view of the TMR element taken on line "17—17" in FIG. 16. In these figures, the same references are given to the similar parts to the ones shown in FIGS. 1–3. In the TMR element of this embodiment, the pinned layer 13, the tunnel barrier layer 11 and the free layer 12 are stacked in turn. The bias magnetic field-inductive layer 21 is integrated with the free layer 12, and the flux guide layer 22 is stacked in separation on the bias magnetic field-inductive layer 21.

The first leading electrode portion 291 is electrically joined with a part of the first electrode/magnetic shielding portion 25 and 27 at the position in which the sense current IS in the first electrode/magnetic shielding portion 25 and 27 generates the magnetic field FX1 having the same direction as that of the bias magnetic field FX.

Then, the second leading electrode portion 292 is electrically joined with a part of the second electrode/magnetic shielding portion 26 and 28 at the position in which the sense current IS in the second electrode/magnetic shielding portion 26 and 28 generates the magnetic field FX2 having the same direction as that of the bias magnetic field FX. As a result, the bias magnetic field FX to be applied to the free layer can be reinforced by the magnetic fields FX1 and FX2.

In the embodiments shown in FIGS. 8–17, various arrangements may be employed for the first leading electrode portion 291 and the second leading electrode portion 292 in addition to the ones shown in FIGS. 5–7.

Figure 18:
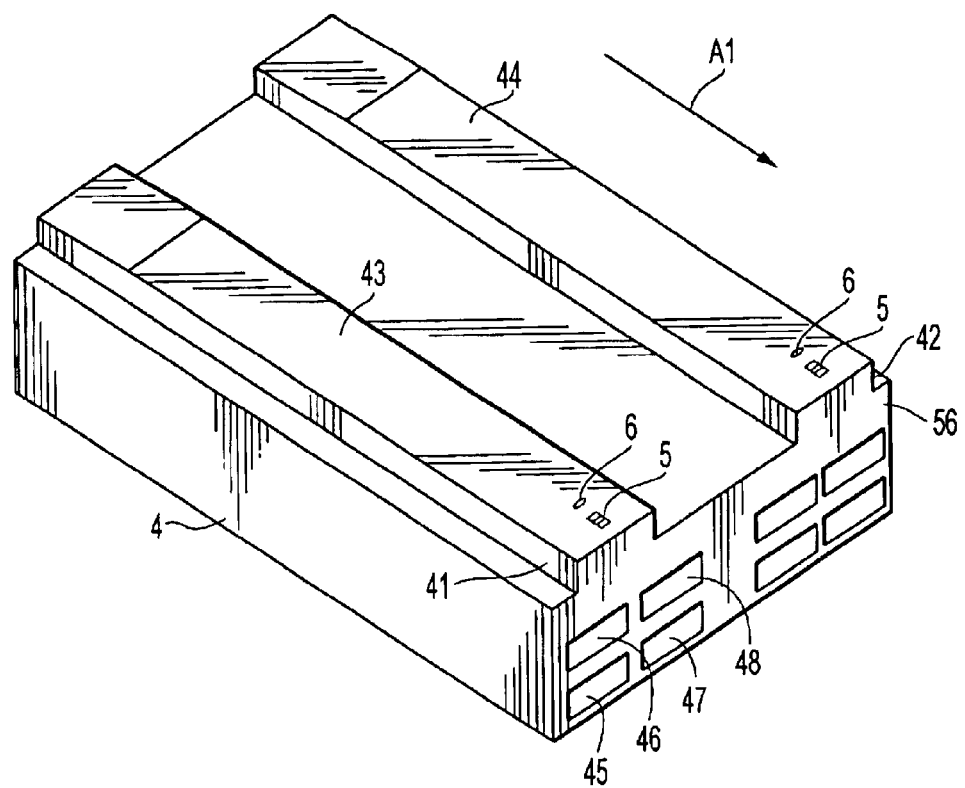
FIG. 18 is a perspective view showing a longitudinal recording thin film magnetic head including the TMR element of the present invention as a reading element and an inductive type electromagnetic converting element as a writing element.
Figure 19:
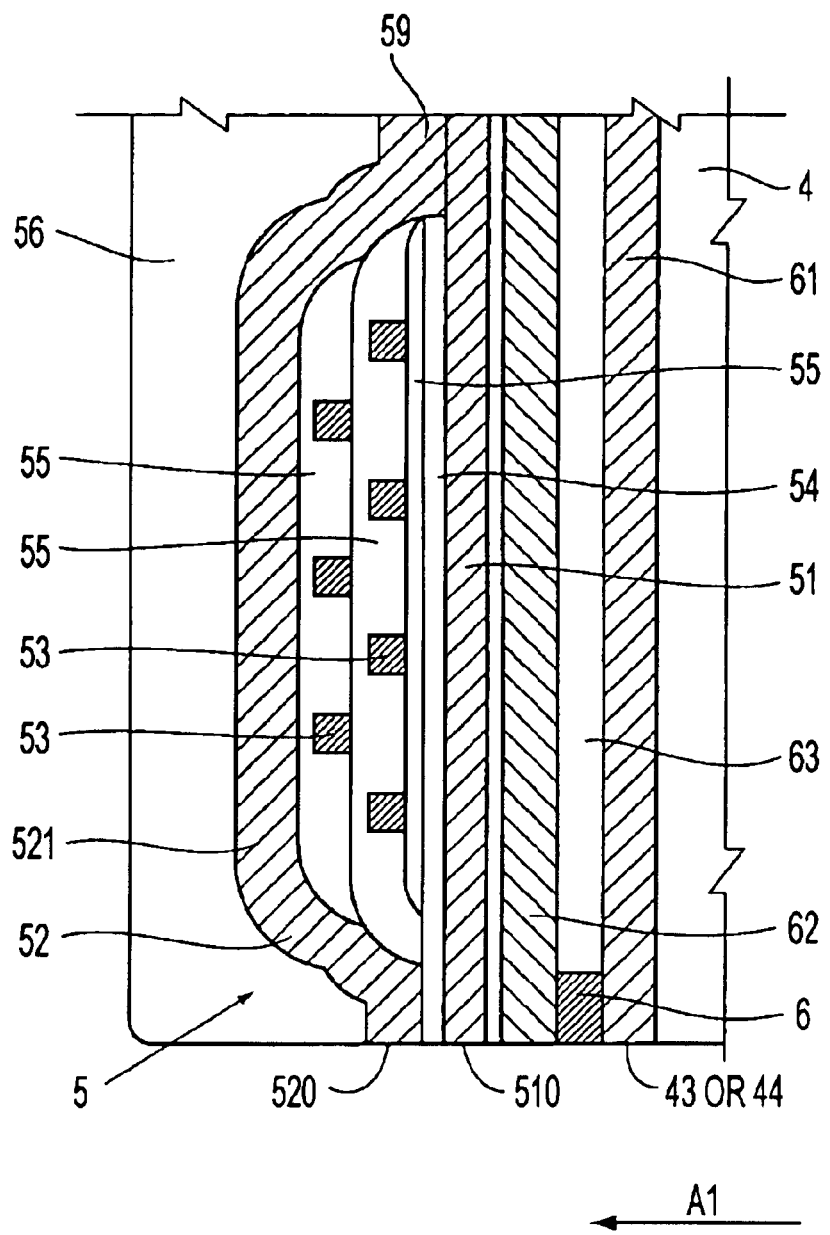
FIG. 19 is an enlarged cross sectional view of the thin film magnetic head shown in FIG. 18.

FIG. 18 is a perspective view showing a longitudinal recording thin film magnetic head having the above TMR element as a reading element and an inductive type magnetoresistive converting element, and FIG. 19 is an enlarged cross sectional view of the thin film magnetic head shown in FIG. 18. The depicted thin film magnetic head has, on a slider 4, a reading element 6 composed of the TMR element of the present invention and a writing element 5 composed of the inductive type magnetoresistive converting element. An arrow A1 designates a medium-running direction. In this figure, the sizes of some parts are exaggerated, and different from the real ones.

The slider 4 has rails 41 and 42 on its opposing surface to a magnetic recording medium, and the surfaces of the rails 41 and 42 are employed as air bearing surfaces (hereinafter, often called as "ABS"s) 43 and 44. The slider 4 does not always have the two rails 41 and 42, and may have one to three rail parts. Moreover, the slider may have a flat surface having no rail. For improving its floating characteristic, the opposing surface of the slider may have various geometrical shapes. This invention can be applied for any types of slider. The slider 41 may have protective films, made of DLC or the like, having a thickness of 8–10 nm on the rails. In this case, the surfaces of the protective films correspond to the ABSs. The slider 41 is a ceramic structural body composed of a substrate 410 made of $Al_2O_3$—TiC, etc. and an inorganic insulating film 420 made of $Al_2O_3$, $SiO_2$ etc. on the substrate 410.

The writing element 5 and the reading element 6 are provided in the trailing edge TR side of either or both of rails 41 and 42. The edge portions of the writing element 5 and the reading element 6 are exposed to the ABSs 43 and 44 for electromagnetic conversion. On the side surfaces in the trailing edge TR are provided pull-out electrodes 45 and 46 connected to the writing element 5 and pull-put electrodes 47 and 48 connected to the reading element 6.

The writing element 5 has a first magnetic film 51 doubling as a second shielding film for the reading element 6, a second magnetic film 52, a coil film 53, a gap film 54 made of alumina or the like, an insulating film 55 and a protective film 56. The second shielding film may be made of another magnetic film.

The forefronts 511 and 521 of the first magnetic film 51 and the second magnetic film 52 are opposed each other via the thin gap film 54, and constitute a pole portion of the thin film magnetic head for writing. The first and second magnetic films 51 and 52 may be composed of a magnetic single layer or a magnetic multilayer for improving the properties of the pole portion. In view of narrowing the track width and developing the recording performance, various modification has been made for the pole portion structure. This invention can be applied for any pole portion structures. The gap film 54 is composed of a non-magnetic metal film or an inorganic insulating film such as alumina.

The second magnetic film 52 is risen up at a given angle on the gap film 54 in the pole portion side. The second magnetic film 52 is extended backward from the ABSs 43 and 44 with keeping a given inner gap for the first magnetic film 51, and joined with the first magnetic film 51 at a backside joining portion 59. As a result, a thin film magnetic circuit is completed with the first and the second magnetic films 51 and 52, and the gap film 54.

The coil film 53 is sandwiched with the first and second magnetic films 51 and 52, and whirled around the backside joining portion 59. Both ends of the coil film 53 are connected to the pull-out electrodes 45 and 46 (see, FIG. 18). The winding number and layer number of the coil film 53 are not restricted. The coil film 53 is embedded in the insulating film 55, which is filled in the inner gap between the first and the second magnetic films 51 and 52 on which the second magnetic film 52 is provided.

The insulating film 55 may be composed of an organic insulating resin film or a ceramic film such as an $Al_2O_3$ film or a $SiO_2$ film. The ceramic insulating film can reduce its maximum protrusion volume than the organic insulating film because it has a smaller heat expansion.

Then, the writing element 5 is covered with a protective film 56 made of an inorganic insulating material such as $Al_2O_3$ or $SiO_2$ entirely.

The reading element 6 is composed of the TMR element of the present invention. The reading element 6 is positioned in an insulating film 63, made of alumina or the like, in between a first shielding film 61 and a second shielding film 62, and connected to the pull-out electrodes 47 and 48 (see, FIG. 18).

Figure 20:
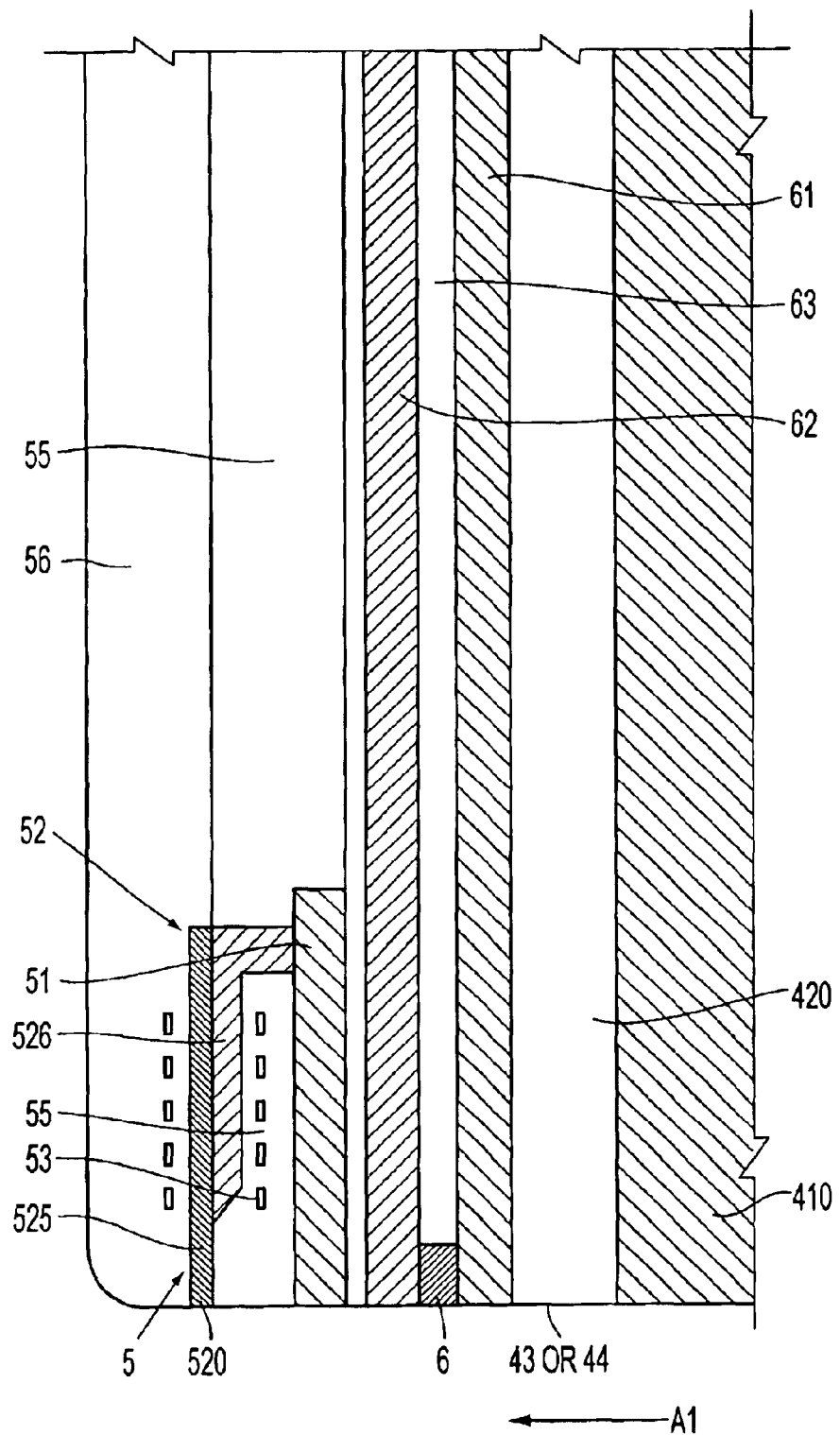
FIG. 20 is an enlarged cross sectional view of a perpendicular recording thin film magnetic head including the TMR element as a reading element.

FIG. 20 is an enlarged cross sectional view showing a perpendicular recording thin film magnetic head. In the perpendicular recording thin film magnetic head, the second magnetic film 52 includes a main magnetic pole 525 and a supplementary magnetic pole 526. The main magnetic pole 525 constitutes a perpendicular writing pole portion, and the supplementary magnetic pole 526 combines the main magnetic pole 525 and the first magnetic film 51 magnetically. The first magnetic film 51 constitutes a returning magnetic path for the magnetic flux generated from the main magnetic pole 525. The coil film 53 is whirled around the main magnetic pole 525 and the supplementary magnetic pole 526. The other parts of the perpendicular recording thin film magnetic head are similar to the ones of the longitudinal recording thin film magnetic head shown in FIG. 18, and thus, detail explanation is not given. The perpendicular recording thin film magnetic head can realize an extremely high density recording because it magnetizes a magnetic recording film of a magnetic disk in a direction perpendicular to the surface thereof.

Figure 21:
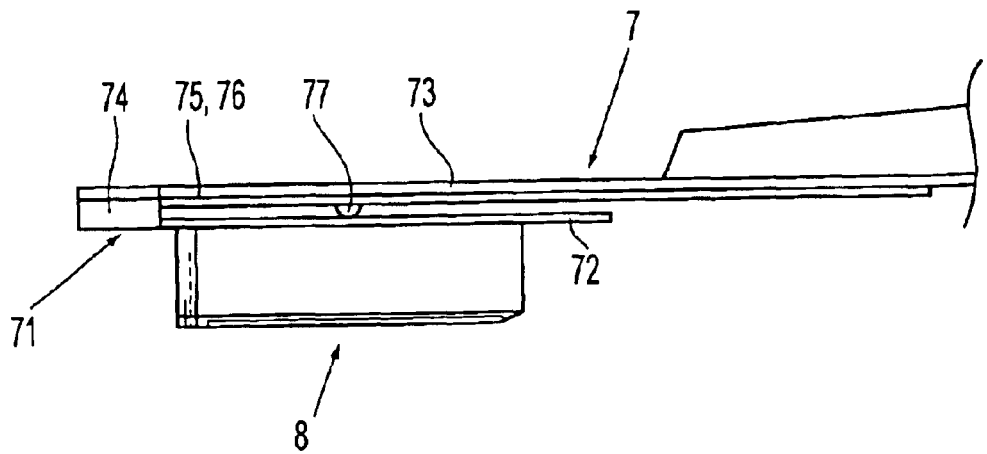
FIG. 21 is an elevational view showing a part of a magnetic head device according to the present invention.
Figure 22:
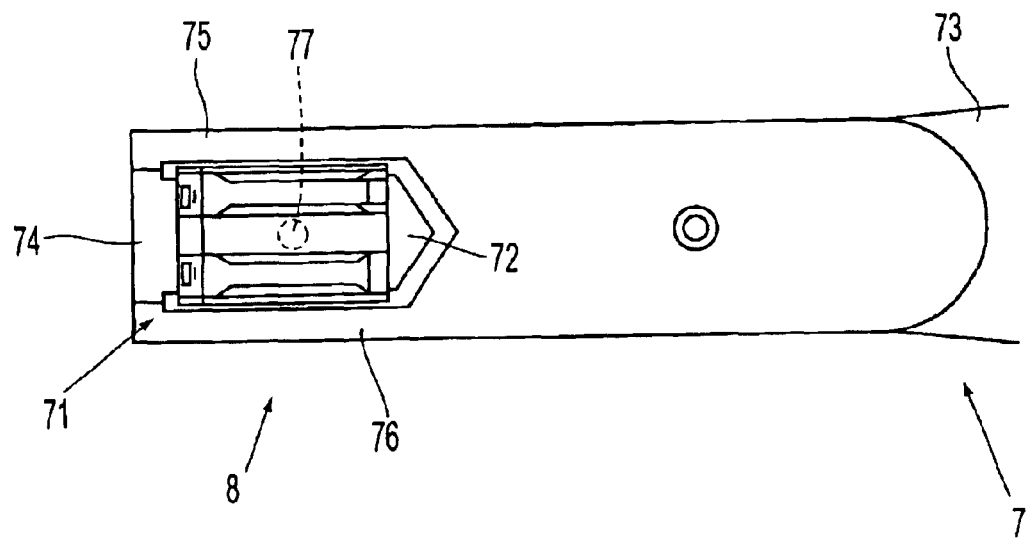
FIG. 22 is an elevational view showing a part of a magnetic head device according to the present invention.

FIG. 21 is an elevational view showing a part of a magnetic head device according to the present invention, and FIG. 22 is a bottom plan view of the magnetic head device in FIG. 21. A depicted magnetic head device includes a thin film magnetic head 8 and a head supporting device 7. The thin film head 8 is similar to the one shown in FIGS. 18–20 according to the present invention.

The head supporting device 7 supports the thin film magnetic head 8 at the under surface of a flexible member 71 made of a metallic plate attached on the free edge thereof in the long direction of a supporting member 73 made of a metallic plate.

The flexible member 71 has two outer frames 75 and 76 extending along the long direction of the supporting member 73, a side frame 74 to join the outer frames 75 and 76 at the edge thereof, and a tongue-shaped member 72, of which one end is a free edge, extending along the outer frames 75 and 76 from the center of the side frame.

On the center of the tongue-shaped member 72 is positioned a hemispherical loading protrusion 77, bulging on the supporting member 73, to apply load to the tongue-shaped member 72.

The thin film magnetic head 8 is attached on the under surface of the tongue-shaped member 72 by adhesive agent so that it can have its air outflow edge along the side frame 74. In addition to the above head supporting device 7, various device may be available.

Figure 23:
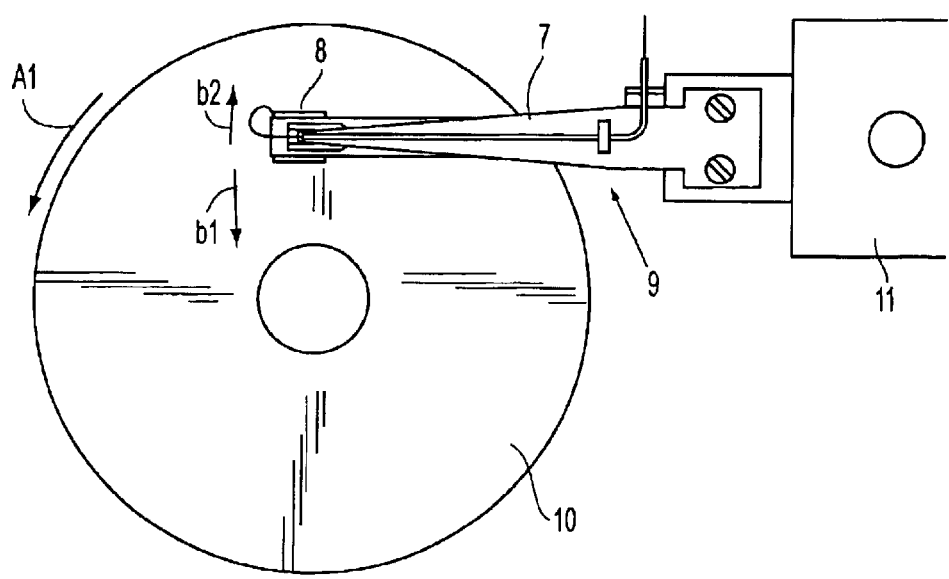
FIG. 23 is a schematic view showing a magnetic disk drive device according to the present invention.

FIG. 23 is a schematic view showing a magnetic disk drive device according to the present invention. The depicted magnetic disk drive device includes a magnetic head device 9 similar to the one shown in FIGS. 21 and 22 and a magnetic disk 10. The magnetic head device 9 is driven by a position determining device 11 which supports one end of the device 9. The thin film magnetic head 8 of the magnetic head device 9 is supported by the head supporting device 5 so that it can face the magnetic recording surface of the magnetic disk 10.

When the magnetic disk 10 is rotated in an Al direction by a not shown driving device, the thin film magnetic head 8 is floated from on the magnetic disk 10 by a minute distance. The magnetic recording drive device shown in FIG. 23 is called as a "rotary-actuator driving system". In this case, the thin film magnetic head 8 attached to the forefront of the head supporting device 7 is driven in a radial direction b1 or b2 of the magnetic disk 10 and positioned on a given track by the position determining device 11 to rotate the head supporting device 7. Then, the magnetic recording and reading are carried out on the given track by the writing element 5 and the reading element 6 having the above TMR element, respectively.

This invention has been described in detail with reference to the above preferred concrete embodiments, but it is obvious for the ordinary person skilled in the art that various modifications can be made in its configuration and detail without departing from the scope of this invention.

As mentioned above, this invention can provide (a) the TMR element, the thin film magnetic head, the magnetic head device and the magnetic disk drive device which are applicable for super high density recording, and (b) the TMR element, the thin film magnetic head, the magnetic head device and the magnetic disk drive device which can enhance the bias magnetic field to be applied to the free layer of the TMR element.

What is claimed is:

1. A tunnel magnetoresistive effective element comprising a ferromagnetic tunnel effective film, a magnetic bias means, a first conductive layer, and a second conductive layer
    the ferromagnetic tunnel effective film has a free layer, a pinned layer and a tunnel barrier layer sandwiched between the free layer and the pinned layer,
    the magnetic bias means applying a bias magnetic field to the free layer,
    the first conductive layer being formed on one surface of the ferromagnetic tunnel effective film so as to be electrically conducted to the ferromagnetic tunnel effective film,
    the second conductive layer being formed on the other surface of the ferromagnetic tunnel effective film so as to be electrically conducted to the ferromagnetic tunnel effective film,
    at least one of the first conductive layer and the second conductive layer generating a magnetic field having the same direction as that of the bias magnetic field through a sense current therein.

2. A tunnel magnetoresistive effective element as defined in claim 1, wherein the first conductive layer includes a first electrode/magnetic shielding portion and a first leading electrode portion, and the first electrode/magnetic shielding portion is provided on the one surface of the ferromagnetic tunnel effective film, and the first leading electrode portion is electrically conducted to a part of the first/magnetic shielding portion at a position in which a magnetic field having the same direction as the bias magnetic field is generated by a sense current in the first electrode/magnetic shielding portion.

3. A tunnel magnetoresistive effective element as defined in claim 2, wherein the first leading electrode portion is electrically conducted to the part of the first electrode/magnetic shielding portion at a position, along the bias magnetic field direction, apart from a center line of the ferromagnetic tunnel effective film orthogonal to the bias magnetic field.

4. A tunnel magnetoresistive effective element as defined in claim 2, wherein the second conductive layer includes a second electrode/magnetic shielding portion and a second leading electrode portion, and the second electrode/magnetic shielding portion is provided on the other surface of the ferromagnetic tunnel effective film, and the second leading electrode portion is electrically conducted to a part of the second electrode/magnetic shielding portion at a position in which a magnetic field having the same direction as that of the bias magnetic field is generated by a sense current in the second electrode/magnetic shielding portion.

5. A tunnel magnetoresistive effective element as defined in claim 4, wherein the second leading electrode portion is electrically conducted to the part of the second electrode/magnetic shielding portion at a position, along the bias magnetic field direction, apart from the center line of the ferromagnetic tunnel effective film orthogonal to the bias magnetic field.

6. A tunnel magnetoresistive effective element as defined in claim 4, wherein the first leading electrode portion and the second leading electrode portion are provided in respective different sides from the center line of the ferromagnetic tunnel effective film.

7. A tunnel magnetoresistive effective element as defined in claim 4, wherein the first leading electrode portion and the second leading electrode portion are provided in either side from the center line of the ferromagnetic tunnel effective film.

8. A tunnel magnetoresistive effective element as defined in claim 6, wherein a planer angle of a line segment to a first center point of a boundary line between the first electrode/magnetic shielding portion and the first leading electrode portion from a center point of the ferromagnetic tunnel effective film for the bias magnetic field direction or a planer angle of a line segment to a second center point of a boundary line between the second electrode/magnetic shielding portion and the second leading electrode portion from the center point of the ferromagnetic tunnel effective film for the bias magnetic field direction is set to 5 degrees or over.

9. A tunnel magnetoresistive effective element as defined in claim 1, wherein the magnetic bias means includes a bias magnetic field-inductive layer to apply a given bias magnetic field to the free layer of the ferromagnetic tunnel effective film and a magnetic bias applying means to apply a given magnetic field to the bias magnetic field-inductive layer.

10. A tunnel magnetoresistive effective element as defined in claim 9, wherein the bias magnetic field-inductive layer includes a flux guide portion of which one end constitutes a flux probe portion having its width smaller than that of the bias magnetic field-inductive layer and projecting from ends of the bias magnetic field-inductive layer.

11. A tunnel magnetoresistive effective element as defined in claim 10, wherein the magnetic bias means includes a bias magnetic field-inductive layer to apply a given bias magnetic field to the free layer of the ferromagnetic tunnel effective film, a magnetic bias applying means to apply a given magnetic field to the bias magnetic field-inductive layer, and a flux guide layer stacked with the bias magnetic field-inductive layer so that its longitudinal direction is crossed to the bias magnetic field from the bias magnetic field-inductive layer and magnetically joined with the free layer of the ferromagnetic tunnel effective film, one end of the flux guide layer constituting a flux probe portion having its width smaller than that of the bias magnetic field-inductive layer and projecting from ends of the bias magnetic field-inductive layer.

12. A thin film magnetic head comprising at least one reading element composed of a tunnel magnetoresistive effective element as defined claim 1.

13. A thin film magnetic head as defined in claim 12, further comprising at least one writing element.

14. A thin film magnetic head as defined in claim 13, wherein the writing element is composed of an inductive type electromagnetic converting element including a first magnetic film, a second magnetic film and a gap film, and the forefronts of the first magnetic film and the second magnetic film is separated by the gap film, thereby to constitute a writing pole portion.

15. A thin film magnetic head as defined in claim 13, wherein the writing element is composed of an inductive type electromagnetic converting element including a first magnetic film and a second magnetic film having a main magnetic pole portion to constitute a perpendicular writing pole portion and a supplementary magnetic pole portion to magnetically combine the main magnetic pole portion and the first magnetic film.

16. A magnetic head device comprising a thin film magnetic head as defined in claim 12 and a head supporting device to support the thin film magnetic head.

17. A magnetic recording drive device comprising a magnetic head device as defined in claim 16 and a magnetic disk to be magnetically recorded and reproduced by the magnetic head device.

* * * * *